United States Patent [19]
Wickersheim et al.

[11] Patent Number: 5,110,216
[45] Date of Patent: May 5, 1992

[54] FIBEROPTIC TECHNIQUES FOR MEASURING THE MAGNITUDE OF LOCAL MICROWAVE FIELDS AND POWER

[75] Inventors: Kenneth A. Wickersheim, Menlo Park; Mei H. Sun, Los Altos; James H. Kim, San Jose, all of Calif.

[73] Assignee: Luxtron Corporation, Santa Clara, Calif.

[21] Appl. No.: 472,351

[22] Filed: Jan. 30, 1990

Related U.S. Application Data

[63] Continuation-in-part of Ser. No. 331,685, Mar. 30, 1989, abandoned.

[51] Int. Cl.⁵ .................. G01J 5/18; G01K 11/20; H05B 6/80
[52] U.S. Cl. .................. 374/122; 219/10.55 B; 250/227.14; 324/703; 374/162
[58] Field of Search .............. 374/122, 119, 110, 141, 374/162; 219/10.55 B, 10.55 E; 324/703, 131, 637

[56] References Cited

U.S. PATENT DOCUMENTS

| | | |
|---|---|---|
| 4,136,566 | 1/1979 | Christensen . |
| 4,278,349 | 7/1981 | Sander .............. 374/162 X |
| 4,523,092 | 6/1985 | Nelson . |
| 4,540,293 | 9/1985 | Shores . |
| 4,652,143 | 3/1987 | Wickersheim et al. . |
| 4,816,634 | 3/1989 | Lentz et al. ........... 219/10.55 B |
| 4,822,966 | 4/1989 | Matsubara . |

FOREIGN PATENT DOCUMENTS 2045921 11/1980 United Kingdom .

OTHER PUBLICATIONS

N.T.T.S. Technical Notes, No. 4,J, Apr. 1986, Springfied, VI, US. p. 0449; 'contactless calorimetry for levitated samples'.
'INT Microwave Symposium 1975', May 12, 1975, I.E.E.E., Palo Alto, CA, US. Gandi et al.: "A nonpert. LC fib.opt. mw pwprobe" * pp. 297-299 *.
Bowman, R. R., "Some Recent Developments in the Characterization and Measurement of Hazardous Electromagnetic Fields", *Biological Effects and Health Hazards of Microwave Radiation,* Polish Medical Publishers, 1974, pp. 217-227.
Huang, Hua-Feng, "Microwave Food Packaging—What to Specify and How to Measure", in Packaging for Convenience Foods, published by DuPont, and presented at the 23rd Microwave Power Symposium, Aug. 30, 1988.
Turpin, C., "Browning & Crisping: The Functions, Design, and Operation of Susceptors", *Microwave World,* vol. 10, No. 6, 1989, pp. 8-12.
Rozzell et al., "Measurement of Temperature and Microwave Power Using Liquid Crystal/Optic Fiber Probes", Conference Proceedings, 5th European Microwave Conference, Hamburg, Germany, Sep. 1-4, 1975.
Masterson, "Photonic Electric-Field Probe for Frequencies Up to 2 GHz.", *Proceedings of SPIE,* vol. 720, 1986, pp. 100-104.
Martin et al., "Fiber Optic Microwave Power Probe", (List continued on next page.)

*Primary Examiner*—Daniel M. Yasich
*Attorney, Agent, or Firm*—Majestic, Parsons, Siebert & Hsue

[57] ABSTRACT

Fiberoptic sensors of various configurations are provided for measuring the magnitude of the electric or magnetic fields, and thereby the power, at local points within a relatively high-power electromagnetic heating environment such as occurs, for example, in a microwave oven or an industrial microwave processing chamber. Each type of sensor includes one element that is heated by either the oscillating electric or magnetic field, and an optical temperature measuring element positioned to be heated by the first element, its temperature being optically determined by an instrument to which an opposite end of the optical fiber length is connected.

53 Claims, 6 Drawing Sheets

OTHER PUBLICATIONS

*Optical Engineering*, vol. 26, No. 2, Feb. 1987, pp. 170-173.

Gibes et al., "An Improved Fiber Optic Current Sensing System for High Frequency RF Susceptibility Measurements", *EMC Technology*, vol. 5, No. 7, Nov./Dec. 1987, pp. 45-50.

Bean, "The Adaptation of Fluoroptic Thermometry for EED Instrumentation", Intl. Conf. Electromagnetic Compatibility, May 10-12, 1988, pp. T15.15-T15.22.

Cernosek, "High Frequency Fluoroptic Thermometry Current Sensing for Weapon Susceptibility Testing", Intl. Conf. Electromagnetic Compatibility, May 10-12, 1988, pp. T15.23-15.29.

Gibes et al., "Optical Technique for Measurement of Currents Induced by Microwave Frequency Radiation: II. Probe Design and Sensor Materials", Intl. Conf. Electromagnetic Compatibility, May 10-12, 1988, pp. T15.7-T15.13.

Jensen et al., "Optical Technique for Measurement of Currents Induced by Microwave Frequency Radiation: I. Basic Technology and Instrument Design", Intl. Conf. Electromagnetic Compatibility, May 10-12, 1988, pp. T15.1-T15.6.

Randa et al., "High Frequency Electric Field Probe Development", Intl. Conf. Electromagnetic Compatibility, May 10-12, 1988, pp. T15.31-T15.37.

*Journal of Microwave Power and Electromagnetic Energy*, vol. 23, No. 3, 1988, p. 197, last paragraph.

Randa et al., "Thermo-Optic Designs for Microwave and Millimeter-Wave Electric-Field Probes", IEEE EMC Meeting, Denver, Colo., May 25-27, 1989.

Wickersheim et al., "Fiber Optic Sensing Techniques for Use in High Frequency/Microwave Processing and Heating Applications", Conference Papers, International Conference, High Frequency/Micro Wave Processing and Heating, KEMA, Arnheim, The Netherlands, Sep. 16-29, 1989, pp. 3-4-1 to 3-4-10.

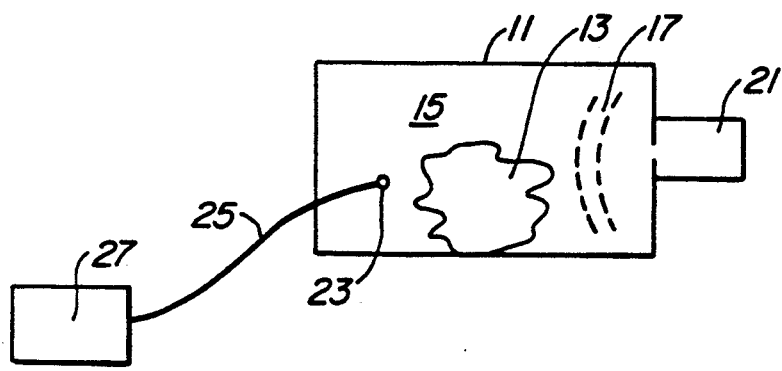
FIG._1.
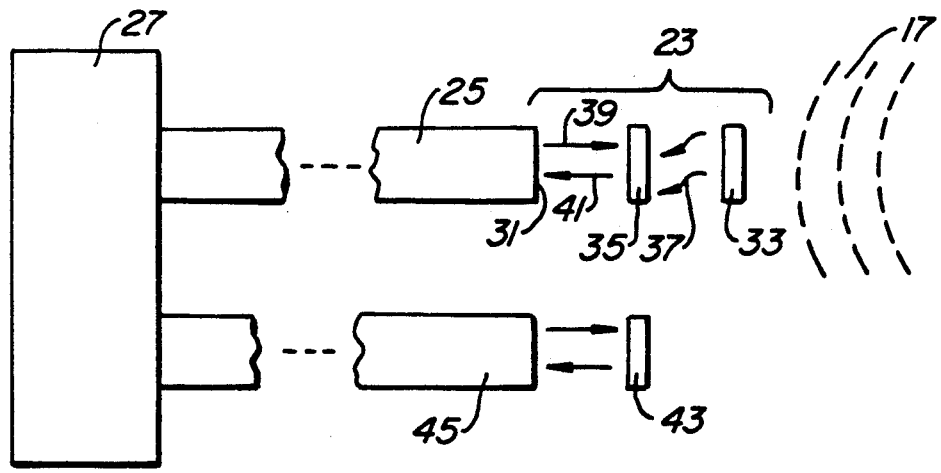
FIG._2.

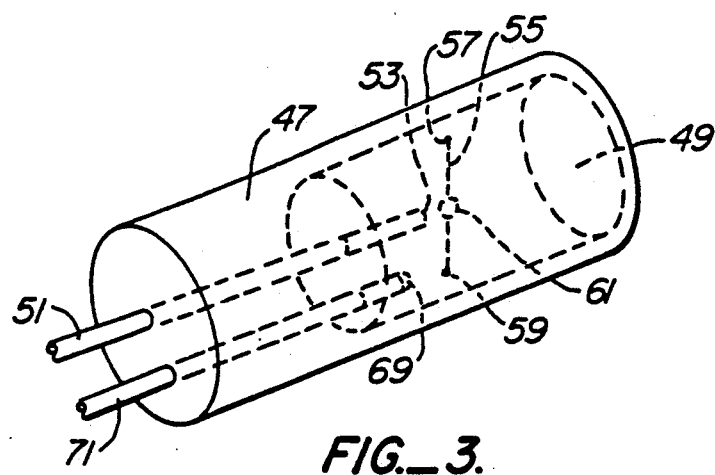
FIG._3.
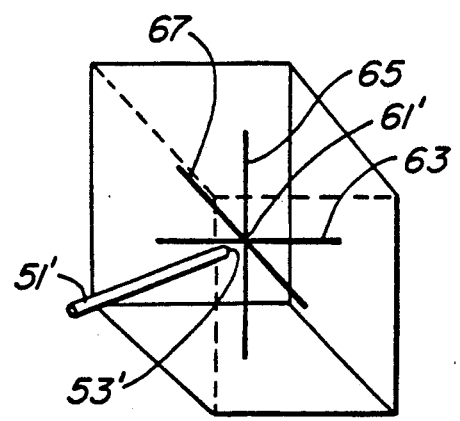
FIG._4.
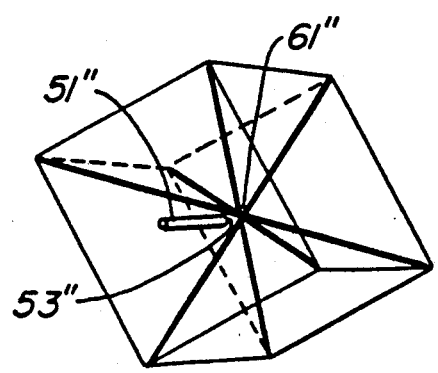
FIG._5.

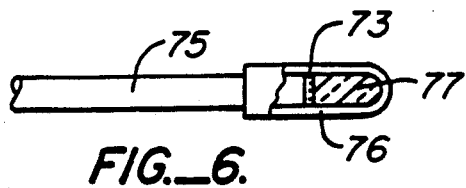
FIG._6.
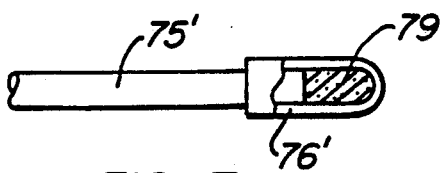
FIG._7.
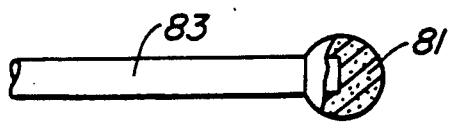
FIG._8.
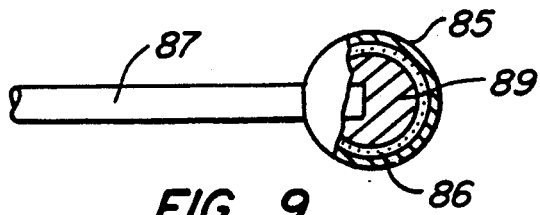
FIG._9.

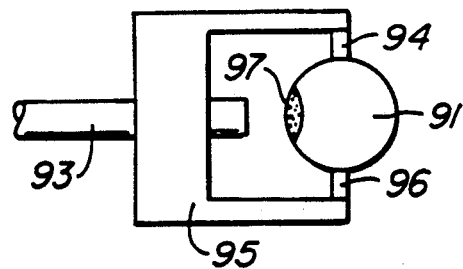
FIG._10.
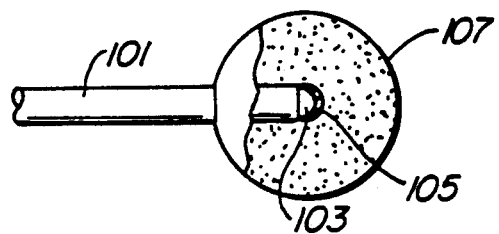
FIG._11.
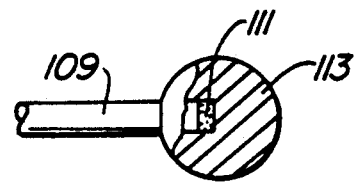
FIG._12.
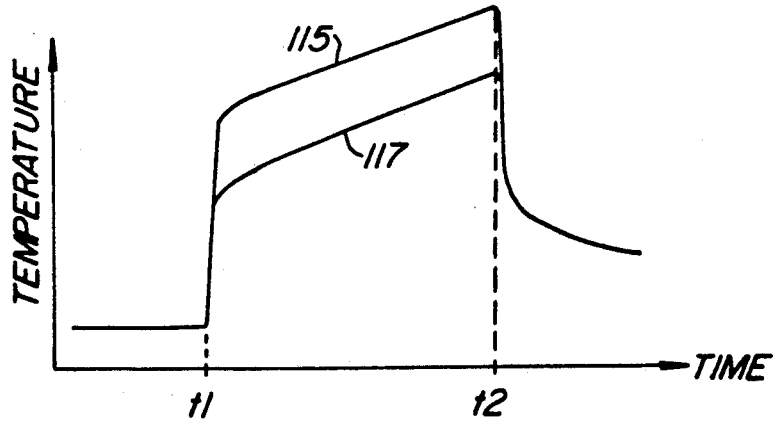
FIG._13A.
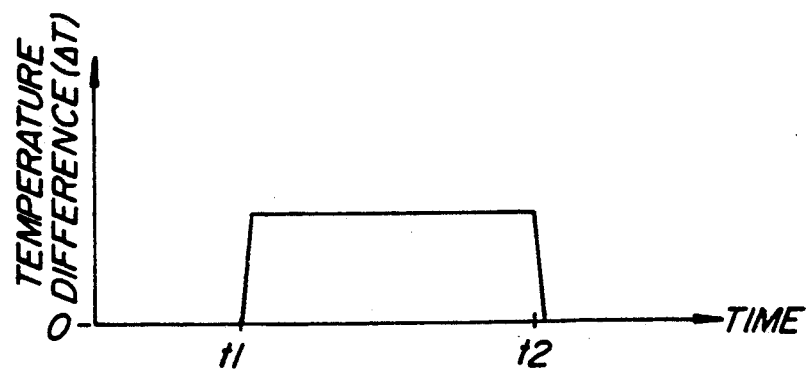
FIG._13B.

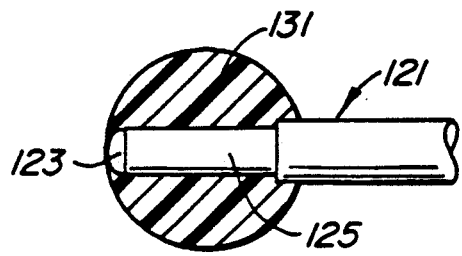
FIG._14A.
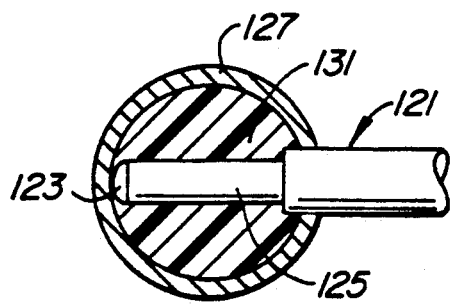
FIG._14B.
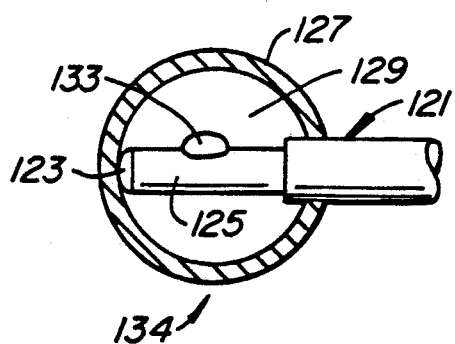
FIG._14C.

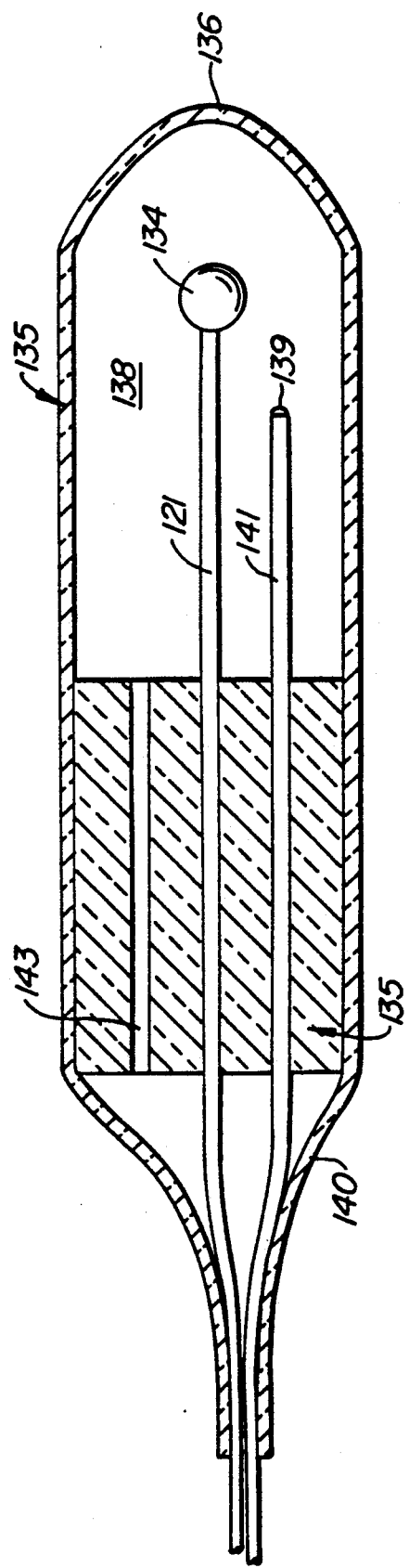
FIG._15.

FIBEROPTIC TECHNIQUES FOR MEASURING THE MAGNITUDE OF LOCAL MICROWAVE FIELDS AND POWER

CROSS-REFERENCE TO RELATED APPLICATIONS

This is a continuation-in-part of application Ser. No. 07/331,685, filed Mar. 30, 1989, now abandoned.

BACKGROUND OF THE INVENTION

This invention relates generally to methods, sensors and instrumentation for measuring the strength of electromagnetic fields and power, particularly in the microwave region of the spectrum.

The use of microwave energy for heating dielectric materials rapidly is well-known and increasing. The majority of homes in the United States now have microwave ovens. As a result, a wide variety of new microwave food products, formulated and packaged for most effective "cooking" in the microwave oven, are being developed and introduced to the market.

At the same time, electromagnetic radiation within the microwave and radio frequency ranges is being used increasingly in industry for processing various dielectric materials—e.g., plastics, rubber, wood products and ceramics. The primary desired result is to produce throughout the product volume very rapid heating and thereby quick drying, curing, firing and so on. The primary variable under the control of the user or operator is the average applied power which in turn relates directly to the average strength of the fields present in the processing chamber.

The incident electromagnetic waves in these and similar processes consist of time-varying E (electric) and H (magnetic) fields oriented at right angles to one another and to the direction of propagation. Either the E-field or H-field can produce heating but normally the E-field produces the dominant effects. The E-field produces oscillating current flow and thereby resistive heating if the medium is conductive. The E-field can also produce oscillating motion of bound charges (polarization) and reorientation of permanently polar molecules (such as water), and these effects also lead ultimately to heating. Interest in H-field measurements is limited primarily to the processing of magnetic materials or, occasionally, to the indirect measurement of currents induced by electromagnetic waves in processing chamber walls. The power available at a given point in a processing chamber is proportional to the square of the effective field, either E or H.

There are several reasons for measuring these fields, particularly the E-field, either prior to or during processing of materials with electromagnetic energy. First, knowing the field variations (or the average power distributions derived therefrom) in the processing chamber allows an improved prediction of heating rates and uniformity. If an altered power distribution is desired, the chamber or the product can be modified as necessary.

Second, during processing, the material being processed will further alter the microwave field and power distributions within the material because of the larger dielectric constant of the material relative to free space or air and the absorption of microwaves by the material. Knowledge of these effects can be further utilized to optimize the size, composition, and shape of the product and/or the speed of processing.

Third, because of the absorption of microwave energy by the material being processed, the fields and power at other points in the chamber will be modified (typically reduced). Thus, by measuring the fields or power at a point outside of the material, it may then be possible to monitor and control its processing. Such a remote sensor can either be located elsewhere within the processing chamber or in a waveguide leading from the chamber to a dummy load.

Fourth, a particular problem of interest involves optimizing the design of a microwave food product utilizing "active" packaging—i.e. packaging which either preferentially concentrates or homogenizes the microwave energy distribution incident on the food product or, in the case of metallic susceptor films, absorbs additional microwave energy locally in the film to provide preferential heating of adjacent portions of the food product (e.g., the crust of a pizza or sausage roll). A very small probe capable of measuring local fields within the package or food product would be useful in evaluating the degree to which the microwave power distribution internal to the product has been altered by the specific package design.

A fifth reason for measuring the level of such fields pertains to computer modeling. As better computer models are developed for analyzing and eventually optimizing food product designs, good input data, including local microwave fields, will be needed for these models. Field probes will therefore be needed to provide this information internal to the product.

Present field measurement techniques are electrical and utilize electrically-conducting antennas of various designs. These antennas have typically been developed for measuring weak fields, as for example the leakage of microwaves from a closed, operating oven. Such antennas cannot survive, let alone measure, the intense heating fields inside of an operating oven or processing chamber.

Such leakage field monitoring antennas have been designed for the most efficient coupling to the fields being measured. For maximum efficiency of coupling, a dipole antenna is typically designed with a length that is one-half the wavelength of the radiation being measured. The microwave oven operates at $245\phi$ MHz. The wavelength corresponding to this frequency in free space (or air) is about 12 cm. Hence, a half wavelength dipole is a little over 2 inches in length. An orthogonal array of three crossed dipoles is normally used to provide orientation-independent measurements. This array is typically contained in a polystyrene foam sphere, both for protection and for insulation. The outer sphere then has a diameter of about 2 ½" or greater, a size which is too large to allow detailed mapping within the oven and which would be impossible to use for measurements internal to a typical food product.

It is preferable not to use highly conductive metals within the regions being measured since the presence of such conductors alter the fields being measured. Both the electrical antenna and its leads would perturb the measurement environment, leading to incorrect values for the field distributions. In addition, the presence of these conductors may also lead to electrical arcing and shorting to ground, again interfering with the measurement.

For these reasons, it is suggested instead that the field measurements be made by thermal techniques, using a small, minimally-perturbing sensor designed to be heated predictably by the oscillating fields with the resultant temperature rise then being measured by passive fiberoptic techniques. For example, Luxtron Corporation, assignee of the present application, has perfected a phosphor-based temperature sensing technology which can be used with either remote viewing or with the phosphor sensor attached to the end of an optical fiber. By monitoring the fluorescent decay time of the phosphor, one can determine its temperature. (The application of such a technique for measurement of high frequency fields and power in conjunction with a resistive antenna of conventional dimensions relative to the wavelengths of interest has been suggested by Martin et al. "Fiber Optic Microwave Power Probe", *Optical Engineering*, Feb. 1987, vol. 26, no. 2, pp. 170-173, and by Randa et al, "High Frequency Electric Field Probe Development", Symposium Record of the International Conference on Electromagnetic Compatibility, May 10-12, 1988.)

Recently this luminescent fiberoptic technique has been applied to the measurement of currents induced by high frequency fields in the firing circuits of electroexplosive devices ("EEDs") used in ordnance systems. The bridge wire of the EED is a resistive conductor whose current is raised by the high frequency induced current flowing through it. As expected, the temperature rise is proportional to the resistance and to the square of the induced current. The EED thus becomes a current sensor for detecting currents induced in the cabling of the firing circuit connected to it. Calibration of the sensor is performed by injecting known currents and noting the resultant temperature rises. Such an EED technique is described by Gibes et al., "An Improved Fiber Optic Current Sensing System for High Frequency RF Susceptibility Measurements", *EMC Technology*, Nov.-Dec. 1987, vol. 6, no. 7, pp. 45-50.

It is a primary object of the present invention to provide sensors, instrumentation and techniques for measuring high levels of electromagnetic power, in microwave and other regions, with a sensor that is physically quite small, does not disturb the thermal characteristics or the electromagnetic fields of the environment being measured, which provides an accurate, repeatable measurement of the field, and which is easy and economical to implement.

SUMMARY OF THE INVENTION

These and additional objects are accomplished by the various aspects of the present invention wherein, briefly and generally, according to a preferred form, a sensor is provided at an end of a length of optical fiber, and has two primary elements, namely: a first element adapted to be heated by either or both of the electrical field or the magnetic field components of the microwave radiation environment in which the sensor is placed, and a second element in thermal contact with the first element having at least one optical characteristic that changes as a function of its temperature and which is detectable at an opposite end of the optical fiber by an instrument provided for that purpose. For electric (E) field measuring sensors, the first element can include one or more short electrically resistive wires, in either a one-dimensional, two-dimensional or a three-dimensional arrangement, a sphere made from a resistively conductive material, or a quantity of a polar dielectric material. For a magnetic (H) field sensor, either an electrically resistive current loop, such as one provided by a sphere made from a material of adequately high electrical conductivity, or a quantity of electrically non-conductive, magnetizable (i.e., ferrimagnetic) material is provided.

Specific configurations and materials for such sensors are part of the present invention, as described hereinafter with respect to specific examples of such sensors. The sensors are made to be quite small in physical size in order to make detailed field and power mapping possible. The sensors are intentionally made to have a poor coupling with the high power microwave fields in order that the sensors will not be damaged and the fields will not be unduly perturbed by the presence of the sensors. The sensors may even be imbedded in materials being heated by the microwave fields, or may be positioned outside of the material but within the chamber (such as a microwave oven) that confines the microwave energy. The sensors can also be used for making free field measurements of power or field strength, such as in the mapping of high power antenna beam patterns.

Additional objects, advantages and features of the various aspects of the present invention will become apparent from the following description of its preferred embodiments, which description should be taken in conjunction with the accompanying drawings.

BRIEF DESCRIPTION OF THE DRAWINGS

FIG. 1 illustrates an application of the various sensors and techniques of the present invention;

FIG. 2 schematically illustrates a system embodying the various aspects of the present invention;

FIG. 3 is one embodiment of a sensor according to the present invention;

FIGS. 4 and 5 illustrate variations of the embodiment of FIG. 3;

FIGS. 6 and 7 show different examples of a sensor according to a second embodiment of the present invention;

FIG. 8 illustrates a sensor according to a third embodiment of the present invention;

FIG. 9 illustrates a sensor according to fourth embodiment of the present invention;

FIG. 10 shows a sensor according to a fifth embodiment of the present invention;

FIG. 11 shows a sensor according to a sixth embodiment of the present invention;

FIG. 12 illustrates a sensor according to a seventh embodiment of the present invention;

FIGS. 13A and 13B are curves that illustrate operation of the type of sensor shown in FIGS. 3-5;

FIGS. 14A through 14C illustrate a method of making a sensor according to a eighth embodiment of the present invention; and FIG. 15 shows an assembly utilizing the sensor made according to the technique of FIGS. 14A through 14C.

DESCRIPTION OF THE PREFERRED EMBODIMENTS

Referring initially to FIG. 1, an enclosure 11 contains an item 13 in a space 15 within the enclosure 11 that is being heated by high frequency electromagnetic radiation 17. The radiation is generated by a power source 21 outside of the chamber which transmits electromagnetic radiation by means of a waveguide to the chamber. The system shown in FIG. 1 is representative of the usual home microwave oven, a similar type of oven used commercially, or an industrial processing chamber where microwave energy is used to dry, fire or cure a larger quantity of material as part of an industrial process. In the case of microwave ovens, the material 13 being heated is usually an item of food, while in an industrial process, the material being heated may be a food, plastic, rubber, wood product or ceramic object.

In order to measure the microwave fields or power at various points within the chamber 15, a sensor 23 is positioned within the chamber. The sensor 23 is attached to one end of a length of optical fiber 25, another end of the optical fiber 25 being connected to a measuring instrument 27 that is outside of the chamber 15. The sensor 23 can be embedded in the material 13 being processed, or can be positioned in space anywhere within the chamber 15, depending upon the goal of the measurement that is to be made.

Various forms of the sensor 23 according to the present invention are described in detail below, all of which can be generally described, as an introduction, with respect to the generic diagram of FIG. 2. The sensor is built on an end 31 of the length of optical fiber 25, and includes two primary elements. A first such element 33 is characterized by being heated by the strong microwave field 17. The element 33 can be one of several specific types of microwave absorbers described hereinafter, including an electrically resistive wire or array of wires, a polar dielectric medium, a resistively conducting sphere, a quantity of ferrimagnetic material, and the like, depending upon the application and whether the electric field or magnetic field is desired to be measured.

In any of the specific field sensing probes being described herein, the sensing element 33 operates by elevating its temperature by an amount proportional to the power absorbed which in turn is proportional to the square of the field that is being measured. A second primary element 35 of the sensor 23 measures that temperature rise by optical means. The temperature sensing element 35 is placed in thermal communication with the sensing element 33, as indicated by the heat waves 37, usually by close physical contact that allows unimpeded heat conduction between them. In specific sensor designs where the elements 33 and 35 are not physically contacting each other, a heat conductive medium is provided between them.

The optical temperature sensing element 35 may be of any type that is characterized by exhibiting a change in at least one optical property as a function of temperature that can be detected and measured by the instrument 27 through the optical fiber 25. A preferred optical temperature sensing element 35 is formed from a luminescent material. Several specific types of optical fiber temperature sensing instruments are currently available in the marketplace. The preferred luminescent material for the element 35 and the method used by the instrument 27 to measure temperature of that element is described in U.S. Pat. No. 4,652,143—Wickersheim et al. (1987), which is expressly incorporated herein by reference. As described in that patent, such a luminescent element 35 is excited to fluoresce by a pulse of exciting radiation 39 developed in the instrument 27. This is followed by a decaying pulse of fluorescent radiation 41 from the element 35. It is that rate of decay of this fluorescent light pulse that is measured by the instrument 27 as a measure of the temperature of the element 35.

Other optical fiber temperature measurement techniques may be utilized but are not preferred. An alternative is described in U.S. Pat. No. 4,136,566—Christensen (1979).

No matter what specific technique is used, the optical temperature sensing element 35 is chosen to be of a type that is not itself heated directly by the microwave radiation. Specifically, the temperature sensing element 35 and its signal transmitting leads do not incorporate any electrically conductive materials, any strongly polar dielectric materials, or any magnetic materials. (An exception to this is where the functions of the elements 33 and 35 are performed by a single material or a composite element.)

It may be desirable in certain circumstances to provide, either as part of the sensor 23 or separate from it, a separate temperature sensor made of an optical temperature sensing element 43, preferably including a luminescent material, and a second optical fiber 45 that optically communicates between the sensor 43 and the instrument 27. The optical temperature sensing element 43 is positioned to measure the ambient temperature of the environment in which the sensor 23 is positioned. The second temperature reading provides a base from which the elevated temperature measured by the optical element 35 may be determined at any instant in time. It is that temperature difference that is proportional to the energy absorbed from the incident microwave field 17, and thus to the local power, since the temperature sensor 43 is chosen to be unaffected by the field 17.

The temperatures of each of the sensors 35 and 43 are measured by the instrument 27 discussed previously. Calculation of the local microwave power density or strength can be accomplished by a personal computer (not shown) connected to the instrument 27 used to determine the two temperatures. A difference between the two temperatures is first calculated, and that difference is then used to calculate the microwave quantity being measured according to an empirically determined calibration inputed into computer memory. If it is desired to provide an instrument that is dedicated to such microwave measurements, the optical temperature measuring and computer functions can be integrated into a single device.

The various aspects of the present invention can be applied to a number of specific microwave frequencies, and even to electromagnetic frequencies in radio frequency ranges outside of the microwave spectrum. Home and industrial microwave ovens usually operate at about 2450 MHz., a frequency allocated for industrial, scientific and medical use by the Federal Communications Commission of the United States government. Other commonly used frequencies allocated for that purpose are at approximately 13, 27 and 915 MHz. Most industrial, scientific and medical microwave heating systems operate within these allocated frequency ranges, since to operate at other frequencies would require the use of heavily shielded rooms to contain any strong radiation.

Another application of the microwave sensing techniques of the present invention is to measure the strength of microwave fields produced by radar or communications equipment, medical hyperthermia equipment, military electromagnetic radiation testing facilities, and any other application where strong electromagnetic radiation within or near the microwave frequency range is being utilized. The small size and easy positioning of the sensors being described herein make them especially convenient to measure the power of field distribution across a microwave field. An example is to measure the profile of a microwave antenna beam pattern. A profile can be obtained by either taking a plurality of measurements across a beam with a single sensor or by simultaneously using a plurality of sensors positioned across the beam. The microwave frequency range is considered to extend from about 300 MHz. to 300 GHz.

The sensors being described are specially adapted for use in high power microwave environments, such as occur inside a microwave oven or directly in the path of a microwave beam from a transmitter, and are not specifically designed for detecting low level radiation, such as may be found to be leaking from such devices. Other, more conventional techniques are better suited for measuring low-level, leakage radiation.

FIG. 3 illustrates a sensor for measuring the intensity of the electric field component of microwave radiation. In order to support the sensor elements, and fix them with respect to one another, a cylindrically shaped housing 47 is provided. The housing 47 has a cylindrically shaped bore 49 in one end thereof. At another end thereof, an optical fiber 51 extends along the axis of the cylinder of the housing 47, into the bore 49 and terminating at a position 53. The radiation sensing element corresponding to element 33 of FIG. 2 is a short piece of electrically resistive wire 55. The wire 55 extends between the inner walls of the bore 49 and is attached thereto at its ends 57 and 59. In about the middle of the length of the wire 55 is attached a layer or quantity 61 of luminescent material that corresponds to the optical temperature sensing element 35 of FIG. 2.

The housing 47 is made from a plastic material that is neither electrically nor thermally conductive. The wire sensor 55 is of small diameter and is preferably made of a resistively conducting metal such as tungsten wire of the type used in electric light bulbs, or of nichrome or of other resistive fibers such as carbon-loaded plastic. The wire sensor 55 is electrically isolated from its surroundings. The only part of the sensor of FIG. 3 that interacts with the microwave radiation field in which it is placed is the short piece of wire 55. In order to minimize the amount of heat that might be conducted away from this sensor down the optical fiber 51, the fiber end 53 is spaced a short distance away from the luminescent material 61. The air gap between the fiber and the luminescent material 61 provides a thermally insulative layer. The luminescent material 61 is, of course, attached to the wire 55 in a manner to maximize the thermal conductivity between the two.

In addition to providing mechanical support for the wire 55, the housing 47 protects the wire sensor somewhat from the effects of air currents of varying temperatures that might exist where the sensor is being used. The open end of the bore 49 further may be sealed (not shown) to form an enclosed cavity filled with air, thereby to make it even more insensitive to air currents of varying temperatures. Such sealing also allows the sensor to be immersed in liquids without liquid contacting the sensor elements.

The length of the wire 55 is chosen to be small relative to the wavelength of the microwave field being measured. The wavelength in air of the popular 2450 MHz. frequency used in microwave cooking is about 12 centimeters, and for 915 MHz. about 32 centimeters. A usual microwave field measuring technique utilizing a resonant antenna requires the antenna to be one-half wavelength long, or about six centimeters in length, to measure a 2450 MHz. field. In the case of the sensor of FIG. 3, however, the length of the wire 55 is intentionally chosen to be significantly non-resonant with the microwave field being measured. For the 2450 MHz. frequency, the length of the wire 55 is typically made to be less than two centimeters, and preferably less than one centimeter. It is that length, by necessity, that controls the diameter of the sensor's cylindrical housing 47. The diameter may be reduced for a given length of wire 55 by tilting the wire along the axis of the cylindrical sleeve 47. And, of course, other physical arrangements than that shown in FIG. 3 may be utilized for providing the same function as described to be necessary for that sensor.

An advantage of using a thin wire sensor as illustrated in FIG. 3 is that it has very little thermal mass and thus will be heated quite rapidly by the electric field component of the microwave radiation in which it is placed as shown in FIG. 13A. It will also cool rapidly when removed from that radiation field, thus providing a quick response to changing radiation levels or to movement of the sensor within a microwave radiation field that is not uniform. The sensor does not perturb the radiation field significantly since it is very weakly coupled with it by being of a length far from that which would be resonant with the microwave radiation being measured.

The sensor of FIG. 3 is obviously quite directional. That is, the measured temperature rise of the wire sensor 55 is dependent in part upon the orientation of its length with respect to the electric field of the microwave radiation. There are applications where it is desired to be able to determine field directions, and thus a highly directional sensor is desired. In most applications, however, it is desired to have a sensor that is not directional. Such a non-directional (isotropic) field sensor can be made by using a plurality of short wires, instead of one, and orienting them in a symmetric three-dimensional pattern. An example of this is shown in FIG. 4 where three lengths of wire 63, 65 and 67 are oriented substantially orthogonally to each other and joined at their midpoints where the luminescent sensing material 61' is attached. The ends of the three wires 63, 65 and 67 are attached to the cylindrical sensor housing 47, in this example of a modification of what is shown in FIG. 3. Each of the wires 63, 65 and 67 is made to have the same length and characteristics as the single wire 55 as described with respect to that embodiment.

The imaginary cube in FIG. 4 is intended to illustrate the symmetric orientation of the wires with respect to each other and with respect to the communicating optical fiber 51'. Each end of the wires 63, 65 and 67 is terminated at a mid-point of a different side of that cube. The optical fiber 51' extends from a corner of that cube to position its end 53' a short distance from the luminescent temperature sensor 61'. The heating of the luminescent sensor 61' is substantially the same no matter what the orientation of this modified sensor illustrated in FIG. 4 with respect to the microwave field in which it is placed.

FIG. 5 illustrates yet another modification of the sensor of FIG. 3 where four lengths of resistive wire are joined together at their mid-points where the luminescent sensor 61" is attached. Each of the lengths of wires extends between opposite corners of an imaginary cube shown in FIG. 5, while the fiber 51" enters the cube through a mid-point in one face thereof so that its end 53" is positioned a short distance away from the luminescent material sensor 61". As with the embodiment of FIG. 4, the length of each of the individual wires, material, and so forth, are similar to that described for the individual wire 55 of FIG. 3.

It is frequently desired in the sensor of FIG. 3 to provide a way of measuring the ambient temperature within the bore 49, in order to provide a base reference point for measuring the temperature rise of the wire 55 above ambient, and thus to be able to determine exactly how much temperature rise measured through the fiber 51 is due to the microwave field being measured as opposed to change in the temperature of the environment surrounding the sensor. Therefore, implementing the second temperature sensor 43 of FIG. 2, a second luminescent sensor 69 is attached to a second optical fiber 71 that is carried by the cylindrical housing 47 (FIG. 3). The sensor 69 is of a standard commercial type, being designed to measure the temperature of the environment in which it is immersed. The sensor 69 is positioned far enough away from the wire 55 so that it measures principally the temperature of the air adjacent to the heated wires.

Curves of FIG. 13A show the results of an electric field measurement with the sensor of FIG. 3, modified to include the three crossed wires of FIG. 4. A curve 115 shows the variation in temperature of the sensor 61' during application of a microwave power pulse. A microwave field of constant magnitude is turned on at a time t1 and turned off at a time t2. A curve 117 shows the temperature variation of the reference sensor 69 during the same time interval. The temperature of the reference sensor 69 increases during the t1-t2 interval as a result of the air within the cavity 49 of the sensor being heated by the wire sensors. A difference in the temperature measured by the two sensors 61' and 69' however, remains substantially constant during the interval when the microwave power is turned on, as indicated by the curve of FIG. 13B. It is this temperature difference which is proportional to the microwave power lever in the environment in which the sensor is positioned.

As an alternative to the structure of the sensors of FIGS. 3-5, the housing 47 may be omitted. In this case, the wire(s) are made to be self supporting by selection of the wire material and diameter. Silicon carbide fiber is satisfactory. The wire structure is supported by attachment to its associated optical fiber end at the location of the luminescent material. Using the embodiment of FIG. 4 as an example, this modification would cause the wires 63, 65 and 67 to be attached to the optical fiber end 53' at the point where they are attached to each other and carry the luminescent material 61'. This modified structure has the advantage that any adverse thermal or dielectric effects of the housing 47 on a desired isotropic characteristic of the sensor are eliminated. The advantages of the housing 47 discussed above are not, of course, present in such an arrangement.

As opposed to the sensor examples of FIGS. 3-5, sensors illustrated in FIGS. 6, 7 and 8 contain no electrically conductive element in order to measure the electric field component of microwave radiation. Rather than heating an electrically resistive element, the oscillating electric field in these sensor embodiments causes heating by inducing molecular rotation of highly polar molecules in a dielectric medium. In the specific form of FIG. 6, a luminescent or other optical temperature sensor 73 is attached to an end of an optical fiber 75. A cap 76 holds a quantity of the polar dielectric material 77 immediately adjacent the temperature sensor 73. It is the material 77 that becomes heated an amount proportional to the square of the electric field in which it is placed. Water molecules are useful for this purpose since they have a permanent electric dipole moment. Water molecules are therefore caused to rotate by an oscillating electric field, thus causing heating. However, very little water is required for use in high power fields and so must be diluted with a non-polar dielectric material in many cases. It may be diluted by mixing a small amount of water into a gel or paste. Because of the semi-liquid form of such a sensor 77, containment may be required, as by the cap 76, in order to provide physical stability and to reduce evaporative losses.

Other less sensitive forms of a water-based sensor 77 might include a stable hydrated crystal, such as gypsum, or water adsorbed on silica gel. Polarizable materials not having a permanent dipole moment may also be utilized, although the heating effects would be much weaker. The sensor of FIG. 6 has an advantage over the wire sensor embodiments of FIGS. 3-5 because of its smaller size and since it operates by virtue of bulk absorption and is thus inherently more isotropic.

FIG. 7 shows a sensor that is a modified version of that of FIG. 6. Rather than having the optical temperature sensor material 73 and the dielectric 77 in separate but physically adjacent volumes, particles of the optical sensor are dispersed, in the embodiment of FIG. 7, throughout the volume of a dielectric 79. This is appropriate where the dielectric 79 is substantially optically transparent, and results in better thermal contact between the dielectric element, whose temperature rise is being measured, and the optical material that is measuring that rise. It is particularly convenient when the optical sensor is a phosphor since particles of such a material can easily be formed and dispersed in the dielectric volume.

Another form of a dielectric electric field measuring probe is shown in FIG. 8 wherein a volume 81 of a polar solid material is formed directly on the end of an optical fiber 83. An example of such a material is Nylon 66. If the material is substantially optically transparent, particles of luminescent material, as the optical temperature sensor, can be dispersed in it, as shown in FIG. 8. Alternatively, if the material is not transparent enough, the luminescent layer may be attached directly to the end of the optical fiber 83 but in thermal contact with the dielectric material 81.

The sensors described with respect to FIGS. 3-8 have almost no response to the magnetic field vector of the electromagnetic waves. FIG. 9 shows a sensor configuration that can be used to measure the level of the magnetic field. A layer 85 of electrically resistive material is carried by an end of an optical fiber 87. A significant amount of surface area of the layer 85 is provided. In order to make the sensor isotropic, it is preferable that surface be formed in a spherical shape, as shown in FIG. 9. The level of resistivity and size of the sensor determines its responsiveness to the electric or magnetic field components. Other elements of the sensor include a luminescent material layer 86 also attached to an end of the optical fiber 87. A hard, transparent epoxy "ball" 89 surrounds the end of the fiber and supports the luminescent layer 86 and the magnetic field sensing electrically resistive overcoating 85. The diameter of the epoxy ball 89 is made large enough, typically 1 to 2 millimeters in diameter, to provide the necessary amount of surface area in order to result in a high enough temperature rise from the field being measured to allow accurate measurement. Material suitable for the layer 85 includes carbon or silver-loaded epoxy.

The sensor of FIG. 9 operates as a small current loop. When the conductivity of the spherical surface 85 is high enough that it absorbs magnetic radiation, the oscillating H field being measured penetrates the resistive spherical surface and generates currents in the resistive layer in a plane at right angles to the field vector. These currents cause Joule heating in the resistive surface layer and the optical temperature sensor detects this heating.

Another specific embodiment of an isotropic field sensor is shown in FIG. 10, wherein a ball 91 is coated with an electrically resistive material like that of the layer 85 of the embodiment of FIG. 9. In this case, however, the ball 91 is held displaced a short distance from an end of the optical fiber 93 by thermally insulative support elements 94 and 96 carried by a primary support member 95. In this embodiment, the optical temperature sensor is in the form of a luminescent layer 97 deposited on top of, and thus in thermal contact with, the electrically resistive layer that heats up in the electromagnetic field. This embodiment, although somewhat more complicated than that of FIG. 9, has an advantage of providing an air gap between the heated electrically resistive material layer and the optical fiber, thus reducing heat conduction by the optical fiber away from the region being measured. In order to minimize heat conduction through the ball's support structure, the portions 94 and 96 are preferably thin glass or plastic fiber filaments.

FIG. 11 illustrates another form of magnetic field sensor. An optical fiber 101 has a hard hemispherical ball 103 of substantially optically clear epoxy attached to an end thereof. Surrounding this hemisphere is a layer 105 of temperature sensing luminescent material. Further, surrounding the temperature sensing layer 105 and the hemisphere 103, is another, larger sphere 107. The sphere 107 contains particles, as shown, of electrically conductive material. Material suitable for the particles within the sphere 107 are silver or carbon.

As an alternative to using electrically resistive current loops in the magnetic field sensor, as is utilized in each of the example sensors of FIGS. 9 and 10, a non-conducting magnetic (i.e., ferrimagnetic) material may be used. Referring to FIG. 12, an optical fiber 109 includes a luminescent temperature sensing layer 111 attached to its end. Surrounding the luminescent layer 111 is a solid quantity 113 of a ferrimagnetic material. An example of such a material is a microwave ferrite or yttrium iron garnet. This material is characterized by being electrically non-conducting but magnetizable. It is the magnetic equivalent, for the purposes of measuring a varying magnetic field component of microwave radiation, of the dielectric sensor described earlier for the purpose of measuring the electrical field component.

A further embodiment of a ferrimagnetic material sensor employs the configuration described above with respect to FIG. 10. But in this case, the sphere 91 is made of solid ferrimagnetic material and the luminescent layer 97 is coated over a portion of its surface.

Referring to FIGS. 14A–14C, a technique for making another sensor having a spherically shaped electrically conductive shell is illustrated by sectional views taken through approximately the center of the spherical elements. FIG. 14C shows the completed sensor formed at an end of an optical fiber 121. An optical temperature sensor 123 is attached to an end portion 125 of the optical fiber wherein its outer protective sheath has been removed. A thin spherical element that becomes heated in an electromagnetic field by absorption of either its electric or magnetic field component, or both, is physically carried by the optical fiber 121 with the temperature sensor 123 in thermal communication with the sphere 127 by physical contact with an inside surface of the sphere. The physical arrangement of the sensor of this embodiment differs from that of FIG. 9 primarily by the positioning of the optical temperature sensing material. Also, the embodiment of FIG. 14C, an interior region 129 is hollow rather than being filled with a supporting ball 89 of the FIG. 9 embodiment.

A first step in making the sensor of FIG. 14C is to push the optical fiber end 121 though a spherical bead 131 of polystyrene foam, the material used in making popular thermal insulative coffee cups. The bead outside diameter is small, such as approximately 2 mm., and allows penetration of the optical fiber end portion 125, typically about 0.4 mm. in diameter. The optical fiber 121 is pushed far enough into the bead 131 from one side until its temperature sensor 123 just begins to emerge from an opposite side.

The assembly of FIG. 14A is then dipped into a liquid mixture to form the shell 127 shown in FIG. 14B. In one embodiment, this liquid is a slurry mixture of tin oxide as the active electromagnetic sensing material and a water based binder such as potassium silicate. The resulting coated bead 131 of FIG. 14B is then heated to a maximum of 200 degrees centigrade, resulting in the structure shown in FIG. 14C. The heating step dries the coating on the bead 131 to form a hard shell 127. A shell thickness of about 0.2 mm. is desireable. At the same time, the polystyrene bead 131 is melted by the heating step and, upon cooling, leaves a much smaller bead 133 attached to a surface inside the shell 127, usually on the optical fiber portion 125. Because the polystyrene sphere 131 is mostly air, its size reduction is dramatic when it melts. The resulting hollow sensor 134 of FIG. 14C has a very low amount of thermal mass and thus provides a quick response to measure the strength of an electromagnetic field in which the sensor is positioned.

A main advantage of a spherically shaped sensor (any of the embodiments of FIGS. 8–12 and 14) is that it is quite insensitive to its orientation within (i.e., is isotropic with respect to) the electromagnetic field being measured, regardless of whether the sensor is more responsive to the electric or magnetic component of that field. Isotropy is usually desired but such sensors can be formed in other shapes when a directional sensitivity is needed for a special application. The method of FIGS. 14A–14C can certainly be used to form the shell 127 in other enclosed shapes by starting with the polystyrene bead 131 in a different shape.

The degree to which the sensor 134 responds to the electric or magnetic components of a microwave field is determined primarily by the level of electrical conductivity (or, inversely, resistivity) of the shell 127 and its diameter relative to the wavelength of the electromagnetic field being measured. As the conductivity is increased for a given size shell, the percentage of the magnetic field component absorbed by the shell 127 goes up while the percentage of the electric field component absorbed goes down. If the conductivity is decreased, the reverse occurs. The tin oxide shell 127 of this specific example makes a sensor 134 that is predominately an electric field sensor.

As a further use of the method described with respect to FIGS. 14A-14C, a sensor of the type shown in FIG. 9 may be made with a substantially hollow region in its middle instead of the epoxy ball 89. In this case, the polystyrene bead 131 is first coated with a temperature sensing luminescent material layer that becomes the layer 86 (FIG. 9), and then is coated with an electromagnetic field heating layer, as described above, that becomes the layer 85 (FIG. 9). Heating of the polystyrene bead, now coated with two layers, leaves a modified FIG. 9 sensor having low thermal mass and in which optical signals communicate between the luminescent material layer 86 and an end of the optical fiber 87 through a void.

The sensor 134 of FIG. 14C can be used alone but it is generally preferable to provide such a sensor as part of a structure that also incorporates a reference temperature sensor in order to make a differential temperature measurement, as previously discussed. Such a composite sensor is shown in a cross-sectional view of FIG. 15. A thin walled cylindrical envelope 135 is shaped to close off one end 136 and receives a plug 137 at an opposite end. Within an enclosed volume 138 so formed is the sensor 134 (FIG. 14C) and a reference temperature sensor 139 provided at an end of an optical fiber 141. The reference sensor 139 is made to be of the same type as the temperature sensor 123 (FIGS. 14A-14C), preferably both of a luminescent type described above and commercially available from Luxtron Corporation and having the same temperature dependent optical characteristics. Both of the optical fibers 121 and 141 penetrate the end plug 137 in separate passages provided for that purpose. Although use of the reference temperature sensor 123 is normally desireable, the enclosure of FIG. 15 is still employed to surround the microwave sensor 134 even when the sensor 123 is not positioned in the interior volume 138. The surrounding structure provides mechanical protection and isolation from air currents which would change the local ambient temperature to the sensing elements. Such changes might otherwise be misinterpreted as being due to the microwave field.

An open passage 143 through the plug 137 vents the enclosed volume 138 to the atmosphere. A sealed enclosure 138 of air is preferred within the sensor so that it reaches a quick thermal equilibrium when the sensor 134 is heated from the microwave field in which it is placed. Thus, the vent 143 is made very small and is included in order to prevent expanding air within the enclosed volume 138 from deforming the envelope 135.

As discussed above, the spherical shape of the radiation absorbing shell 127 results in the sensor 134 being substantially isotropic to the microwave field in which it is placed. The positioning of the sensor 134 in the structure shown in FIG. 15 is chosen to maximize the thermal isotropy of the overall structure. The sensor 134 is supported by its optical fiber 121 alone in a position along a center axis of the cylindrical sleeve 135 in order to be equally spaced from the side walls. It is also positioned about the same distance from its end wall 136. It is, however, positioned a larger distance from the plug 137 because of its much greater thermal mass.

A preferred material for the shell 135 and plug 137 is Teflon or other plastic that is chemically inert and which is insensitive to microwave energy. These materials also desirably have a low thermal mass.

For added strength and moisture resistance, the length of Teflon tubing used for the enclosure 135 can be extended to a point up to several inches from the sensors and can then be heat shrunk onto the optical fibers 121 and 141 emerging from the plug 137, thus forming the tube portion 140. An additional length of heat shrinkable tubing (not shown) may be secured around the optical fibers 121 and 141 for a length from the sensor enclosure 135 to a position near connectors (not shown) provided at opposite free ends of the optical fibers. In either case, the vent 143 is extended through the tubing and the enclosed volume 138 is exhausted to the atmosphere a distance from the sensor, thereby minimizing the entry of contaminants from the atmosphere to the interior 138. This venting also allows the sensor to be submersed in liquid.

The sensor structures of FIGS. 14 and 15 have a significant advantage of providing a broad response over a wide continuous range of microwave wavelengths which are significantly larger than the diameter of the shell 127. Although the composite sensor structure of FIG. 15 is shown to utilize the sensor 134 of FIG. 14C because it is preferred for most microwave field measurement applications, one of the other sensors discussed above may be substituted. Particularly suitable are those which are isotropic to the microwave field but there are many measurement applications were directionality of the sensor is important so an anisotropic one (such as that of FIG. 3) may also be employed.

Each of the electromagnetic field sensors described herein has two basic elements. The first is an absorber of the electric and/or magnetic field components that results in the element being heated. As discussed, this element can be in a number of different forms. The second element is a electromagnetically nonperturbing transducer positioned to measure the temperature rise of the first element when positioned in the field, thus to obtain a quantity that is proportional to the field magnitude. That transducer must not itself absorb electromagnetic radiation or perturb the temperature being measured. Use of the non- o electrically conductive optical temperature measurement techniques described above best satisfy this need from existing technology.

Although the various aspects of the present invention have been described with respect to their preferred embodiments and specific examples, it will be understood that the invention is entitled to protection within the full scope of the appended claims.

It is claimed:

1. A microwave power or field strength sensor, comprising:
   a three-dimensional symmetrically shaped microwave absorbing element characterized by being heated by a microwave field,
   a substantially non-microwave absorbing temperature transducer positioned in thermal communication with said element and adapted to generate a signal proportional to the temperature of the element, and
   a signal transmitting path connecting said temperature signal from said transducer to a location remote from of said element, whereby the microwave power or field strength is measurable from said signal.

2. The sensor according to claim 1 wherein said microwave absorbing element is substantially spherically shaped.

3. The sensor according to either of claims 1 or 2 wherein said microwave absorbing element consists substantially of a thin hollow shell that surrounds the temperature transducer.

4. The sensor according to either of claims 1 or 2 wherein said microwave absorbing element consists of a solid three-dimensional shape in which said temperature transducer is submersed.

5. The sensor according to either of claims 1 or 2 which additionally comprises a substantially non-microwave absorbing enclosure trapping air therein and in which said microwave absorbing element is suspended.

6. The sensor according to either of claims 1 or 2 which additionally comprises a substantially non-microwave absorbing enclosure trapping air therein and in which said microwave absorbing element is suspended, and a reference temperature transducer provided within said enclosure but spaced apart from said microwave absorbing element.

7. The sensor according to either of claims 1 or 2 wherein said microwave absorbing element consists substantially of a thin hollow shell.

8. The sensor according to either of claims 1 or 2 wherein said microwave absorbing element consists of a solid three-dimensional shape.

9. The sensor according to either of claims 1 or 2 wherein said transducer is positioned within said element.

10. An electromagnetic field sensor carried by an end of a length of at least one optical fiber, said sensor comprising:
   a shell of electrically resistive material shaped to substantially surround a dielectric volume into which said optical fiber end extends through said shell,
   temperature sensing means positioned within said volume in thermal communication with said shell and in optical communication with said one fiber end for changing at least one optical characteristic in response to a changing temperature of said shell that is detectable at another end of the optical fiber, whereby the electromagnetic field strength is measurable therefrom.

11. The sensor according to claim 10 wherein said electrically resistive shell is formed in a symmetrical three-dimensional shape.

12. The sensor according to claim 11 wherein said three-dimensional shape is essentially that of a sphere.

13. The sensor according to any one of claims 10-12 wherein said temperature sensing means includes a luminescent material that is characterized by emitting, in response to an excitation pulse, luminescent radiation having a decaying characteristic that is proportional to the temperature of the material.

14. The sensor according to any one of claims 10-12 wherein the volume surrounded by the shell is substantially hollow.

15. The sensor according to any one of claims 10-12 wherein the volume surrounded by the shell includes a solid optically transparent material filling a substantial proportion thereof.

16. The sensor according to any one of claims 10-12 wherein the temperature sensing means is attached to an inside surface of said shell.

17. The sensor according to any one of claims 10-12 wherein the temperature sensing means is attached to the end of the optical fiber.

18. An electromagnetic field sensor, comprising:
   a length of at least one optical fiber having first and second ends, said first end carrying a temperature sensing material that is characterized by changing at least one optical characteristic in response to changing temperature, and
   a hollow shell of electrically resistive material carried by the optical fiber first end, said first optical fiber end extending through said shell and contacting said temperature sensing material to an interior surface of said shell, whereby electromagnetic field strength is measurable by monitoring the changing at least one optical characteristic of the temperature sensing material.

19. The sensor according to claim 18 wherein said electrically resistive shell is formed in a symmetrical three-dimensional shape.

20. The sensor according to claim 19 wherein said three-dimensional shape is essentially that of a sphere.

21. The sensor according to claim 18 wherein said temperature sensing means includes a luminescent material that is characterized by emitting, in response to an excitation pulse, luminescent radiation having a decaying characteristic that is proportional to the temperature of the material.

22. An electromagnetic field sensor, comprising:
   a length of at least one optical fiber having first and second ends,
   an enclosed shell of electrically resistive material carried by the optical fiber first end in a manner that said first optical fiber end extends through said shell in a manner to provide optical communication with an interior of the shell, and
   a temperature sensing material attached to an inside surface of said shell, thereby to be in optical communication with said optical fiber first end, said temperature sensing material being characterized by changing at least one optical characteristic in response to changing temperature,
   whereby electromagnetic field strength is measurable by monitoring at the second optical fiber end the changing optical characteristic of the temperature sensing material.

23. The sensor according to claim 22 wherein said electrically resistive shell is formed in a symmetrical three-dimensional shape.

24. The sensor according to claim 23 wherein said three-dimensional shape is essentially that of a sphere.

25. The sensor according to claim 22 wherein said temperature sensing means includes a luminescent material that is characterized by emitting, in response to an excitation pulse, luminescent radiation having a decaying characteristic that is proportional to the temperature of the material.

26. The sensor according to any one of claims 22-25 wherein the interior of the shell is substantially hollow.

27. The sensor according to any one of claims 22-25 wherein the interior of the shell includes a solid optically transparent material filling a substantial proportion thereof.

28. An optical electric field sensor provided at an end of a length of at least one optical fiber, said sensor comprising:
   a plurality of electrically resistive wires arranged in a spatially symmetric three-dimensional pattern, said plurality of wires being thermally connected to each other at a common point and unconnected to any other electrically conductive elements, and means attached to said wires at said common point of thermal connection and positioned in optical communication with said one optical fiber end for changing at least one optical characteristic in response to its changing temperature that is detectable at another end of said optical fiber.

29. The sensor according to claim 28 wherein said common point of thermal connection between said wires is at approximately their midpoints and said optical temperature sensor includes a luminescent material.

30. The sensor according to claim 28 wherein said common point of thermal connection between said wires is at approximately their midpoints and said wires are substantially symmetrically arranged about said point.

31. The sensor according to claim 28 which additional includes a hollow, non-electrically conductive support structure within which the electrically resistive wires are suspended.

32. The sensor according to any one of claims 28 through 31 wherein said plurality of electrically resistive wires are additionally physically connected to each other at said common point.

33. An electromagnetic field sensor, comprising:
a length of an optical communication medium having first and second ends, said medium including at least one optical fiber extending therebetween,
a temperature sensor attached to said first medium end in a manner to be in optical communication with said second medium end, said sensor including temperature sensing material that is characterized by emitting, in response to an optical radiation excitation pulse, luminescent radiation having a decaying characteristic that is proportional to the temperature of the sensor, and
an enclosed substantially spherically shaped shell of electrically resistive material carried by said first medium end in a manner that said medium passes through said shell and an interior void thereof with said sensor contacting an interior surface of said shell, the interior of said shell including substantially only non-electrically conductive materials,
whereby electromagnetic field strength is measurable by monitoring a decaying luminescence characteristic of the temperature sensing material.

34. The sensor according to claim 33 which additionally comprises a dielectric enclosure trapping air therein and in which said sphere is suspended, and a reference temperature transducer provided within said enclosure but spaced apart from said microwave absorbing element.

35. An optical electric field sensor permanently held by a length of optical fiber adjacent one end thereof, said sensor comprising:
at least one electrically isolated length of electrically resistive wire less than substantially two centimeters long and physically unsupported along a majority of its length, and
means attached to said wire and in optical communication with said one optical fiber end for changing at least one optical characteristic that is detectable in response to its changing temperature at another end of the optical fiber.

36. The sensor according to claim 35 which additionally includes a hollow, non-electrically conductive support structure within which said at least one length of electrically resistive wire is suspended.

37. An electrically non-conductive electric field sensor provided at an end of a length of at least one optical fiber, said sensor comprising:
a quantity of a polar dielectric material characterized by internally generating heat when exposed to high frequency electromagnetic radiation, and
means in thermal communication with said dielectric material and in optical communication with said one optical fiber end for changing at least one detectable optical characteristic in response to changing temperature.

38. The sensor according to claim 37 wherein said dielectric material includes molecules having a permanent electric dipole moment, whereby electric field-induced motion of said molecules generates said heat.

39. The sensor according to claim 31 wherein said molecules with a permanent electric dipole moment include water molecules.

40. An electrically non-conductive magnetic field sensor provided at an end of a length of at least one optical fiber, said sensor comprising:
a quantity of ferrimagnetic material characterized by generating heat when exposed to an oscillating magnetic field, and
means in thermal communication with said quantity of material and in optical communication with said one fiber end for changing at least one detectable optical characteristic in response to its changing temperature.

41. A microwave power or field strength sensor, comprising:
an enclosure made of an electrically non-conductive and microwave radiation non-absorbing material forming a chamber therein,
a microwave energy absorbing element positioned within said chamber,
a temperature measuring transducer positioned within said chamber in thermal communication with said microwave field absorbing element and generating a signal that is proportional to the temperature of said element, and
an electrically non-conductive and microwave radiation non-absorbing temperature signal transmission path extending from said temperature transducer and extending out of said chamber through said enclosure.

42. The sensor according to claim 41 wherein said microwave field absorbing element includes electrically resistive material.

43. The sensor according to claim 42 wherein said resistive material is in the form of at least one wire.

44. The sensor according to claim 42 wherein said resistive material is in the form of a plurality of wires joined together at least one point intermediate of their lengths, and further wherein said temperature transducer is in thermal communication with the wires at said at least one point.

45. The sensor according to claim 42 wherein said resistive material is in the form of a surface layer.

46. The sensor according to claim 42 wherein said resistive material is in the form of a symmetrical three-dimensional shape.

47. The sensor according to claim 46 wherein said symmetrical three-dimensional shape is spherical.

48. The sensor according to claim 46 wherein said resistive material substantially surrounds said temperature transducer.

49. The sensor according to claim 41 wherein said microwave absorbing element includes a polar dielectric material.

50. The sensor according to claim 41 wherein said microwave absorbing element includes a ferrimagnetic material.

51. The sensor according to any one of claims 41–50, inclusive, wherein said enclosure chamber is substantially sealed.

52. The sensor according to any one of claims 41–50, inclusive, which additionally comprises reference temperature transducer positioned within said chamber a distance from said microwave absorbing element and generating a signal proportional to the temperature within said chamber, and an electrically non-conductive and microwave radiation non-absorbing temperature signal transmission path extending from said temperature transducer and extending out of said chamber through said enclosure.

53. A microwave power or field strength monitoring system, comprising:

a sensor according to any one of claims 1, 2 or 34–43, means in said signal transmitting path for detecting the temperature signal from the temperature transducer of the sensor, and means responsive to the detected temperature signal for determining the local power density or field strength of said microwave energy field.

* * * * *

UNITED STATES PATENT AND TRADEMARK OFFICE
CERTIFICATE OF CORRECTION

PATENT NO. : 5,110,216
DATED : May 5, 1992
INVENTOR(S) : Kenneth A. Wickersheim, Hei H. Sun, James H. Kim It is certified that error appears in the above-identified patent and that said Letters Patent is hereby corrected as shown below:

Column 18, line 16, in Claim 39    delete "31"
    insert---38---

Column 18, line 55, in Claim 44    insert---at---
    after "together"

Column 20, line 7, in Claim 53    deleting "1, 2 or 34-43"
and inserting —1, 2 or 41-50—.

Signed and Sealed this

Thirty-first Day of August, 1993

Attest:

BRUCE LEHMAN

Attesting Officer    Commissioner of Patents and Trademarks